United States Patent [19]

Lee

[11] Patent Number: 4,516,095
[45] Date of Patent: May 7, 1985

[54] SURFACE ACOUSTIC WAVE DEVICE

[75] Inventor: Ching W. Lee, Lexington, Mass.

[73] Assignee: GTE Laboratories Incorporated, Waltham, Mass.

[21] Appl. No.: 564,796

[22] Filed: Dec. 23, 1983

[51] Int. Cl.³ .................. H03H 9/42; H03H 9/64; H03H 9/145
[52] U.S. Cl. ................. 333/194; 310/313 R; 333/151; 333/153; 333/196
[58] Field of Search ............... 333/150–155, 333/193–196; 310/313 R, 313 A, 313 B, 313 C, 313 D

[56] References Cited

U.S. PATENT DOCUMENTS

| | | | |
|---|---|---|---|
| 3,727,155 | 4/1973 | De Vries | 333/151 X |
| 3,818,379 | 6/1974 | Wauk | 333/151 |
| 4,090,153 | 5/1978 | Toda et al. | 333/194 X |
| 4,162,415 | 7/1979 | Andreev et al. | 333/179 X |
| 4,188,596 | 2/1980 | Miura | 333/151 |
| 4,470,026 | 9/1984 | Buckinx et al. | 333/194 |

Primary Examiner—Marvin L. Nussbaum
Attorney, Agent, or Firm—David M. Keay

[57] ABSTRACT

An acoustic surface wave device having an acoustic energy absorber of acoustic surface wave absorbing material positioned between the input transducer and the output transducer. The acoustic energy absorber increases the insertion loss of the device and consequently suppresses triple transit signals in the device.

7 Claims, 4 Drawing Figures

SURFACE ACOUSTIC WAVE DEVICE

BACKGROUND OF THE INVENTION

This invention relates to acoustic surface wave devices. More particularly, it is concerned with acoustic surface wave devices employed as filters.

Acoustic surface wave devices employing piezoelectric materials having suitable properties for propagating surface waves and having transducers for launching and receiving acoustic surface waves in the material are well known. Typically, the transducers are arrays of interleaved conductive electrodes deposited on a substrate of the material. In response to electrical signals an input or transmitting transducer launches acoustic surface waves along a predetermined path on the surface of the substrate. An output or receiving transducer detects the acoustic waves and generates electrical signals in response thereto. Typically, acoustic surface wave devices have been employed as delay lines and as filters. Because of the frequency response which can be obtained in an acoustic surface wave device by suitably designing the configuration of the transducer electrodes, particularly desirable bandpass characteristics can be achieved for use of the device as a filter.

In the development of acoustic surface wave devices for use as filters various problems have been encountered. Several secondary effects are present which tend to degrade the performance of the device. Various techniques have been employed to compensate for or avoid certain of these secondary effects. One significant problem of acoustic surface wave devices is the presence of "triple transit signals" which result from the interaction between the input and output transducers. In response to the receipt of acoustic energy from the input transducer, the output transducer causes a fraction of the energy to be directed back toward the input transducer. The input transducer re-transmits a portion of this energy to the output transducer. Thus, a greatly reduced but nevertheless noticeable echo signal is received by the output transducer. This signal which transits the distance between the input and output transducer three times distorts the electrical signal produced by the output transducer.

Various techniques have been employed to eliminate or reduce the effects of these triple transit signals. Reflections of acoustic energy from the edges of the electrodes of the transducers can be suppressed by using electrodes having two elements of one-eighth wavelength in width and separation in place of single element electrodes of one-quarter wavelength in width and separation. Other techniques have been devised in attempts to reduce the effects due to the regenerative action of the received energy with the transducers.

One procedure which may be employed to suppress triple transit signals caused by regeneration is to increase insertion loss. Although increasing insertion loss reduces the signal, the additional suppression of the triple transit signal is twice that of the additional insertion loss. A common technique for increasing insertion loss is the mismatching of the electrical impedance of the device. This technique, however, may cause distortion of the signal and is not effective to the reflections caused by the electrode mass loading and impedance discontinuity. In addition, the electrical impedance mismatching must be achieved externally of the acoustic surface wave device by adjusting the values of the components connected thereto.

SUMMARY OF THE INVENTION

An acoustic surface wave device in accordance with the present invention includes an improved arrangement for suppressing triple transit signals by increasing insertion loss. The acoustic surface wave device comprises an acoustic surface wave propagating medium. An input transducer for launching acoustic surface waves along a propagation path in the medium comprises two sets of interleaved electrodes disposed on the surface of the acoustic surface wave propagating medium. The electrodes extend transversely to the propagation path. An output transducer is disposed across the propagation path for receiving and detecting acoustic surface waves propagated along the propagation path from the input transducer. The output transducer comprises two sets of interleaved electrodes disposed on the surface of the acoustic surface wave propagating medium with the electrodes extending transversely to the propagation path. An acoustic energy absorber of acoustic surface wave absorbing material is interposed across the propagation path between the input transducer and the output transducer for intercepting and attenuating acoustic surface waves propagated along the propagation path. The acoustic energy absorber increases the insertion loss of the device thus suppressing the triple transit signal.

For a better understanding of the present invention, together with other and further objects, advantages and capabilities thereof, reference is made to the following disclosure and appended claims in connection with the above-described drawings.

DETAILED DESCRIPTION OF THE INVENTION

Figure 1:
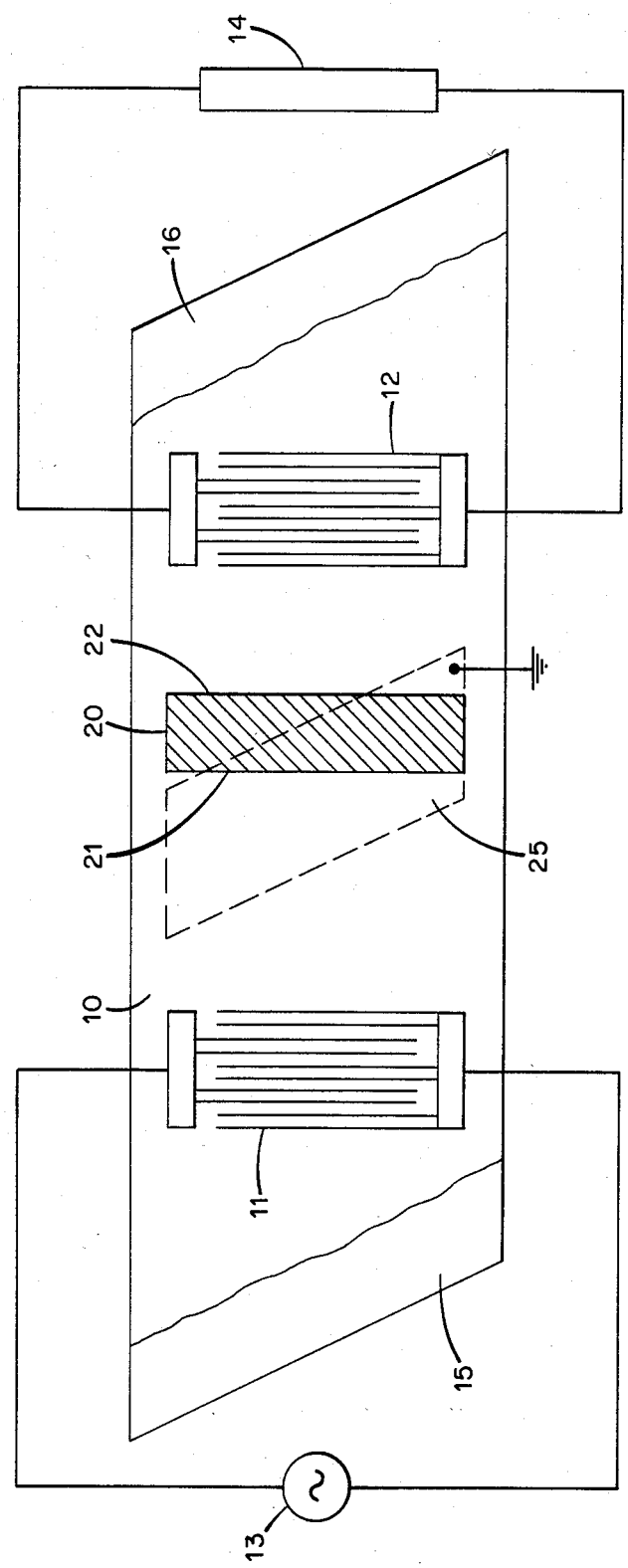
FIG. 1 is a schematic representation of an acoustic surface wave device in accordance with the present invention.

FIG. 1 is a schematic representation of an acoustic surface wave device in accordance with the present invention. The device includes a substrate 10 of a suitable acoustic surface wave propagating material, for example, PZT, lithium niobate, or lithium tantalate. An input or transmitting transducer 11 of conductive material is deposited on the surface of the substrate 10 for launching acoustic surface waves along a propagation path in the substrate. An output or receiving transducer 12 is located across the propagation path in order to receive acoustic surface waves generated by the input transducer 11. A source of electrical signals 13 is connected to the input transducer 11, and the output transducer 12 is connected to a load 14. Two quantities of a suitable acoustic surface wave absorbing material 15 and 16 are located on the substrate 10 near the outer edges in order to absorb extraneous acoustic surface waves and prevent their reflection back toward the transducers.

The input transducer 11 includes two sets of interleaved conductive electrodes deposited on the surface of the substrate 10. As indicated in FIG. 1, each electrode consists of two conductive elements. The source of electrical signal energy 13 is connected across the two sets of electrodes. The input transducer 11 converts electrical energy from the source 13 to mechanical acoustic surface waves which propagate along the propagation path in the medium in a direction transverse to the direction in which the electrodes extend.

The output transducer 12 also includes two sets of interleaved conductive electrodes, each electrode being a double element. The output transducer 12 receives the acoustic surface waves propagated toward it along the propagation path, detects them, and converts them into electrical signals which are applied to the load 14 connected across the two sets of electrodes. As represented, the width of each electrode element and the spacing between adjacent elements is one-eighth of the wavelength of the synchronous frequency of the device.

In accordance with the present invention an acoustic energy absorber 20 is interposed across the propagation path between the input transducer 11 and the output transducer 12 to increase insertion loss. The acoustic energy absorber 20 is of an acoustic surface wave absorbing material which is a good absorber of acoustic surface waves and has large internal losses. Among the materials which may be employed are silicon rubber, epoxy resin, a mixture of silicon rubber and epoxy resin, each of the foregoing mixed with an oxide powder, and wax.

The opposite edges 21 and 22 of the acoustic energy absorber 20 are parallel to the electrodes of the input and output transducers 11 and 12, and thus extend transversely to the propagation path. Desirably the acoustic energy absorber 20 may be produced by conventional screen printing techniques simultaneously with the two quantities of wave absorbing material 15 and 16

The level of signal attenuation $L_{SA}$ and the level of triple transit signal attenuation $L_{TS}$ produced by the acoustic energy absorber may be expressed as:

$$L_{SA} = -10 \log 10^{\sigma W}$$

and $$L_{TS} = -10 \log 10^{2\sigma W}$$

where $\sigma$ in the absorptive coefficient per unit width of the acoustic surface wave absorbing material and W is the width of the absorber across the propagation path. Thus, it can be seen that by increasing the insertion loss the signal is attenuated, but the suppression of the triple transit signal is twice that of the signal.

As indicated in phantom in FIG. 1 a shield 25 of conductive material, which is grounded, may also be interposed across the propagation path in order to eliminate electromagnetic feedthrough from the input transducers 11 to the output transducer 12. The shield 25 may be formed simultaneously with the transducers 11 and 12 of the same conductive material, typically aluminum.

In one specific embodiment devices as illustrated schematically in FIG. 1 were fabricated employing a substrate of YZ lithium niobate. The devices were designed to operate at a synchronous frequency of 43.5 MHz having a wavelength of 78.9 μm in the substrate. The input transducer 11 and the output transducer 12 were the same and were separated by about 2.92 mm. Each transducer had eight pairs of uniformed overlapping electrodes, each electrode having a double element of one-eighth wavelength width with the elements separated by one-eighth wavelength. The acoustic energy absorber 20 was of apiezon wax. The width of the absorber between the edges 21 and 22 was 1.5 mm, and the absorber extended across the entire transducer aperture.

Figure 2A:
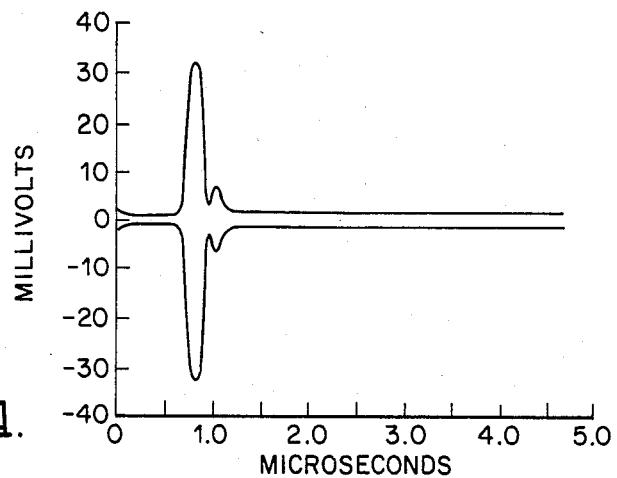
FIG. 2A is a curve illustrating the impulse response of the acoustic surface wave device of FIG. 1.
Figure 2B:
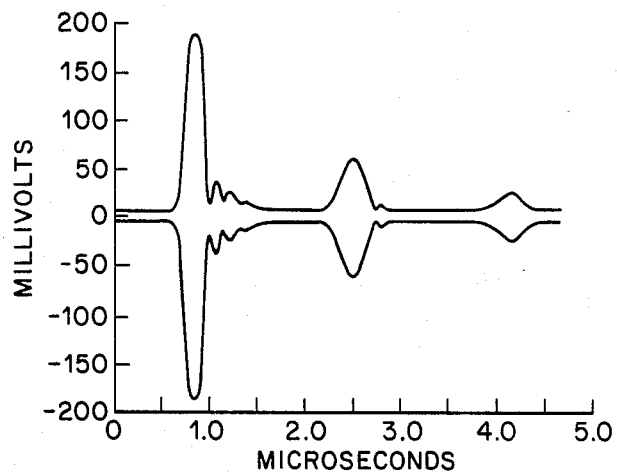
FIG. 2B is a curve illustrating the impulse response of an acoustic surface wave device which is similar to that of FIG. 1. but does not employ an acoustic energy absorber.

FIG. 2A is a curve illustrating the response of a device in accordance with the specific embodiment as described to a single narrow pulse. FIG. 2B illustrates the response of a device which was essentially the same except that the acoustic energy absorber 20 was not present. The acoustic energy absorber 20 increased the insertion loss by approximately 15 dB and consequently suppressed the triple transit signal by 30 dB.

Figure 3:
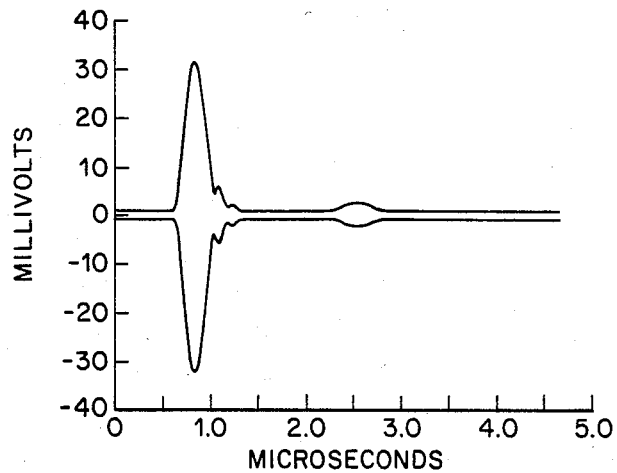
FIG. 3 is a curve illustrating the impulse response of an acoustic surface wave device similar to that used to produce the curve of FIG. 2B with the electrical impedance of the transducers mismatched.

FIG. 3 illustrates the response of a device without an absorber which was electrically impedance mismatched with external inductors and resistors. The resulting signal level was about the same as with a device including an absorber as shown in FIG. 2A, but the triple transit signal was about 15 dB higher.

While there has been shown and described what is considered a preferred embodiment of the present invention, it will be obvious to those skilled in the art that various changes and modifications maybe made therein without departing from the invention as defined by the appended claims.

What is claimed is:

1. An acoustic surface wave device comprising:
an acoustic surface wave propagating medium;
an input transducer for launching acoustic surface waves along a propagation path in said medium, the input transducer comprising two sets of interleaved electrodes disposed on the surface of the acoustic surface wave propagating medium with the electrodes extending transversely to the propagation path;
an output transducer across said propagation path for receiving and detecting acoustic surface waves propagated along the propagation path from the input transducer, the output transducer comprising two sets of interleaved electrodes disposed on the surface of the acoustic surface wave propagating medium with electrodes extending transversely to the propagation path; and
an acoustic energy absorber of acoustic surface wave absorbing material interposed across said propagation path between the input transducer and the output transducer and extending across the entire transducer aperture for intercepting and attenuating acoustic surface waves propagated along said propagation path.

2. An acoustic surface wave device in accordance with claim 1 wherein
said acoustic surface wave absorbing material is a good absorber of acoustic surface waves and has large internal losses.

3. An acoustic surface wave device in accordance with claim 2 wherein
said acoustic energy absorber has first and second opposite edges facing the input transducer and the output transducer, respectively;

said edges lying generally transversely to said propagation path and parallel to the electrodes of the input and output transducers.

4. An acoustic surface wave device in accordance with claim 3 wherein each of said electrodes of said input and output transducers comprises two spaced electrode elements;

each electrode element having a width approximately one-eighth the wavelength of the synchronous frequency of the device and being spaced from an adjacent electrode element by approximately one-eighth the wavelength of the synchronous frequency of the device.

5. An acoustic surface wave device in accordance with claim 4 wherein said acoustic surface wave absorbing material is selected from the group consisting of silicon rubber, epoxy resin, mixture thereof, each of the foregoing mixed with an oxide powder, and wax.

6. An acoustic surface wave device in accordance with claim 5 including a conductive shield disposed across said propagation path on the surface of the acoustic surface wave propagating medium; and means for connecting said conductive shield to ground.

7. An acoustic surface wave device in accordance with claim 6 wherein said acoustic surface wave absorbing material is apeizon wax.

* * * * *